(12) United States Patent
Choi et al.

(10) Patent No.: US 11,776,635 B2
(45) Date of Patent: Oct. 3, 2023

(54) METHOD FOR FINDING OPTIMUM READ VOLTAGE AND FLASH MEMORY SYSTEM

(71) Applicant: INNOGRIT TECHNOLOGIES CO., LTD., Shanghai (CN)

(72) Inventors: Youngjoon Choi, Shanghai (CN); Hung-Chi Chiang, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 224 days.

(21) Appl. No.: 17/464,736

(22) Filed: Sep. 2, 2021

(65) Prior Publication Data

US 2023/0019347 A1 Jan. 19, 2023

(30) Foreign Application Priority Data

Jul. 8, 2021 (CN) .......................... 202110772261.5

(51) Int. Cl.
*G11C 7/00* (2006.01)
*G11C 16/26* (2006.01)
*G11C 16/04* (2006.01)

(52) U.S. Cl.
CPC .......... *G11C 16/26* (2013.01); *G11C 16/0483* (2013.01)

(58) Field of Classification Search
CPC ....... G11C 7/1051; G11C 7/22; G11C 7/1072; G11C 7/1006; G11C 7/1066

USPC ........................................ 365/189.15, 189.14
See application file for complete search history.

(56) References Cited

U.S. PATENT DOCUMENTS

| 8,811,076 B2 | 8/2014 | Venkitachalam et al. |
| 8,953,373 B1 | 2/2015 | Wu et al. |
| 9,330,775 B2 | 5/2016 | Kim et al. |
| 2018/0268891 A1* | 9/2018 | Li ........................ G11C 11/4074 |
| 2019/0198069 A1* | 6/2019 | Kale ....................... G11C 29/36 |

FOREIGN PATENT DOCUMENTS

CN 103928055 A 7/2014

* cited by examiner

*Primary Examiner* — Son T Dinh
(74) *Attorney, Agent, or Firm* — LEYDIG, VOIT & MAYER, LTD.

(57) ABSTRACT

A method for finding an optimum read voltage includes acquiring difference values between state bit counts of different positions. A direction for finding the optimum read voltage is determined based on the difference values. An offset for finding the optimum read voltage is determined based on correspondence between a difference value of bit count and offset. Reading is performed with the offset applied to a current read reference voltage, wherein upon read-success, the current reference voltage superimposed with the offset is the optimum read voltage, and upon read-error, new first and second positions are obtained based on the direction and the offset for finding the optimum read voltage until reading becomes successful.

11 Claims, 4 Drawing Sheets

METHOD FOR FINDING OPTIMUM READ VOLTAGE AND FLASH MEMORY SYSTEM

CROSS-REFERENCE TO RELATED APPLICATION

Priority is claimed to Chinese Patent Application No. CN 2021107722615, filed on Jul. 8, 2021, the entire disclosure of which is hereby incorporated by reference herein.

FIELD

The present invention relates to a flash memory, and in particular to a flash memory system and method for finding an optimum read voltage.

BACKGROUND

Using non-volatile memory systems has become an important way of storing data because the data stored within will not be lost due to power failure. Among these non-volatile memory systems, NAND flash memory is popular because of its advantages of low power consumption and high performance.

When a program operation is performed on a flash memory, each memory cell has specific state information. The state information may represent any bit or data and a threshold voltage distribution is formed to correspond to each state information. After the program operation, a read operation is performed to identify a memory cell with specific state information. U.S. Pat. No. 8,953,373B1 describes an electric charge stored in the cell can be detected in the form of a cell voltage. To read an single-level-cell (SLC) flash memory cell, a flash memory controller provides one or more reference voltages (also referred to as read voltages) to the flash memory. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, a multi-level-cell (MLC) flash memory requires three such reference voltages, and a triple-level-cell (TLC) flash memory requires seven such reference voltages. Thus, reading data from an MLC or TLC flash memory requires multiple reference voltages having optimum values that allow the memory device to correctly detect the stored data values.

However, as integration of flash memory increases, memory cell dimension decreases and noise increase among adjacent cells can shift target conductivity of cell. Conventional methods for aiding the detection of stored data values using reference voltages commonly rely upon an assumption that the reference voltage windows have Gaussian distributions. As operating environment of the flash memory is changed, a variation of the threshold voltage distribution can be induced, these can create an error that is different from the originally programmed state information. For example, a read error may occur due to a change in temperature and an increase in a P/E cycle (Program/Erase cycle). This phenomenon is aggravated by an increase in the density of flash memory and an increase in the size of state information programmed in each memory cell. For example, TLC has lower tolerance for variation than MLC.

Errors in detecting stored data values are reflected in the performance measurement known as bit error rate (BER). The use of Error Correcting Code (ECC) can improve BER to some extent, but the effectiveness of ECC diminishes as improved fabrication processes result in smaller cell features.

Such conventional read retry methods that blindly search for a reference voltage that results in a successful page read can be slow and therefore adversely impact memory throughput. Such methods can severely impact memory throughput in a system having TLC flash memory because the upper page read uses four reference voltages, causing an exponential increase in read retry time. It would be desirable to enable a flash memory controller to determine an optimum reference voltage by performing a minimal number of read retries. This prior art makes a selection of a reference voltage which worked in high frequency among preset candidates. In other words, it is based on historical learning to decide optimum Vref. When history is not accumulated or none of the candidates can make error correction, it fails.

U.S. Pat. No. 8,811,076B2 describes another way to determine an optimum reference voltage is to apply error count of the reference voltage Vref to add/subtract delta (or offset) to find direction to an optimum reference voltage Vref. When current reference voltage Vref is too far from optimum reference voltage Vref, getting error count is impossible because the ECC engine has a limit to find error count. So, when a distribution change is large, it cannot be applied. Another problem is it adopts the linear search concept by keeping adding/subtracting delta and reading again though reference voltage delta can be made smaller at each time.

SUMMARY

In an embodiment, the present disclosure provides a method for finding an optimum read voltage. The method includes acquiring a first difference value between a first state bit count of a first position and a first state bit count of a second position, a second difference value between the first state bit count and a second state bit count at the first position, a third difference value between the first state bit count of the second position and a first state bit count of a third position, and a fourth difference value between the first state bit count and the second state bit count at the second position within a threshold voltage region. A direction for finding an optimum read voltage is determined based on the difference values. An offset for finding the optimum read voltage is determined based on correspondence between a difference value of bit count and offset. Reading is performed with the offset applied to a current read reference voltage, wherein upon read-success, the current reference voltage superimposed with the offset is the optimum read voltage, and upon read-error, a new first position and a new second position are obtained based on the direction and the offset for finding the optimum read voltage until reading becomes successful.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Embodiments of the present invention provide a flash memory system and a method for finding an optimum read voltage, which determines the optimum read voltage based on a single threshold voltage region, improving the probability of soft-decision success.

In an embodiment, the present invention provides a method for finding optimum read voltage. The method includes: acquiring a first difference value (R12) between a first state bit count of a first position (R1) and a first state bit count of a second position (R2), a second difference value (R1Δ(0-1)) between the first state bit count and a second state bit count at the first position, a third difference value (R23) between the first state bit count of the second position (R2) and the first state bit count of a third position (R3), and a fourth difference value (R2Δ(0-1)) between the first state bit count and the second state bit count at the second position within a threshold voltage region; determining a direction for finding an optimum read voltage based on the difference values, and determining an offset for finding the optimum read voltage based on correspondence between difference value of bit count and offset; and reading with the offset applied to a current read reference voltage, upon read-success, the current reference voltage superimposed with the offset is the optimum read voltage, and upon read-error, obtaining a new first position and a new second position based on the direction and the offset for finding the optimum read voltage until reading becomes successful.

Various aspects and examples of embodiments the present invention will now be described. The following description provides specific details for a thorough understanding and enabling description of these examples. Those skilled in the art will understand, however, that embodiments of the present disclosure may be practiced without many of these details.

Figure 1:
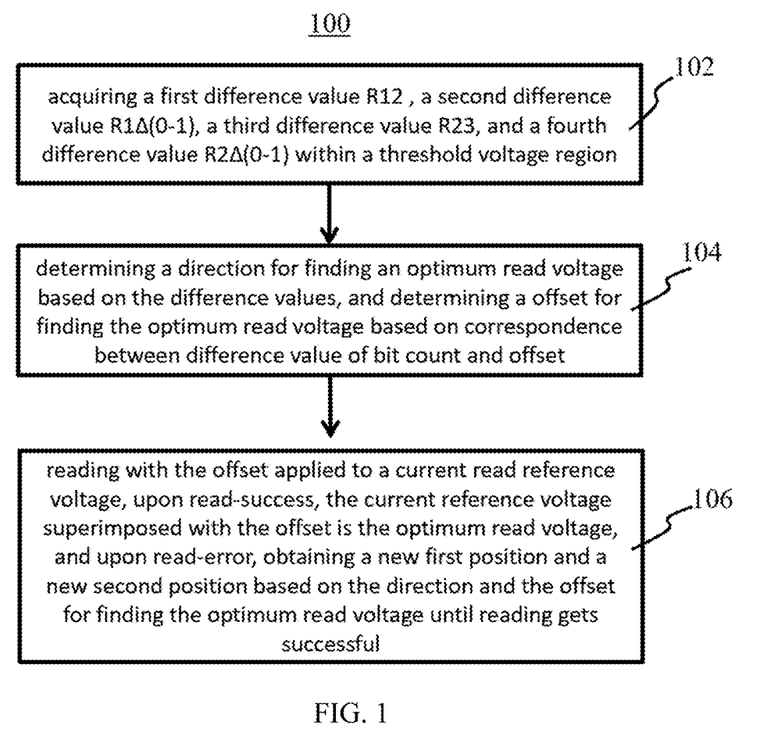
FIG. 1 is a flowchart of a process for finding optimum read voltage in accordance with an embodiment of the present disclosure.

As shown in FIG. 1, the method for an finding optimum read voltage according to an embodiment comprises the following steps: Step 102, Step 104 and Step 106 described in the following.

Step 102: Acquiring a first difference value R12 between a first state bit count of a first position R1 and a first state bit count of a second position R2, a second difference value R1Δ(0-1) between the first state bit count and a second state bit count at the first position, a third difference value R23 between the first state bit count of the second position R2 and the first state bit count of a third position R3, and a fourth difference value R2Δ(0-1) between the first state bit count and the second state bit count at the second position within a threshold voltage region. In an embodiment, the first state is logic "1", the second state is logic "0". It should be noted that the difference values R12, R23, R1Δ(0-1), and R2Δ(0-1) are absolute values.

Figure 2A:
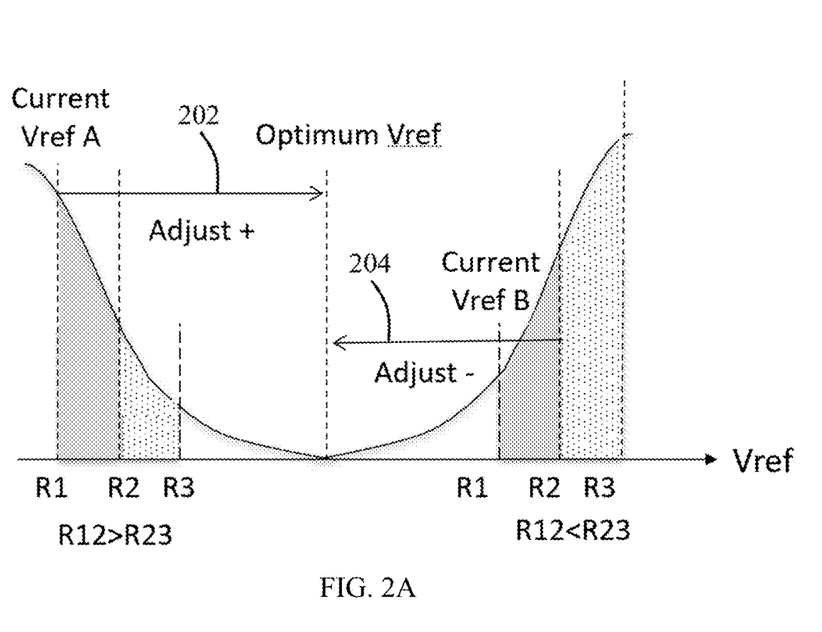
FIGS. 2A and 2B schematically show adjusting the Vref in accordance with an embodiment of the present disclosure.
Figure 2B:
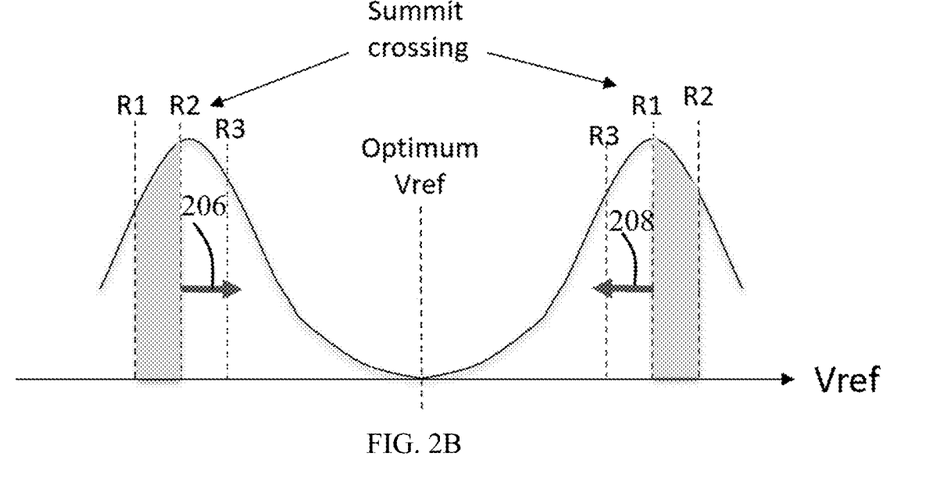

Step 104: Determining a direction for finding an optimum read voltage based on the difference values, and determining an offset for finding the optimum read voltage based on correspondence between difference value of bit count and offset. As shown in FIGS. 2A and 2B, in an embodiment, the step further comprises the following situations.

If the first difference value R12 is greater than the third difference value R23 and the second difference value R1Δ(0-1) is greater than the fourth difference value R2Δ(0-1), determining an increasing direction beginning at the first position as the direction for finding the optimum read voltage, and determining a offset value corresponding to the first difference value R12 as the offset for finding the optimum read voltage, as shown by arrow 202 in FIG. 2A, in this case, the determined reference voltage is R1+offset(R12), and offset(R12) is the offset corresponding to the difference R12.

If the first difference value R12 is smaller than the third difference value R23 and the second difference value R1Δ(0-1) is greater than the fourth difference value R2Δ(0-1), determining an increasing direction beginning at the second position as the direction for finding the optimum read voltage, and determining a offset value corresponding to the third difference value R23 as the offset for finding the optimum read voltage, as shown by arrow 206 in FIG. 2B, threshold voltage summit crosses to the left, in this case, the determined reference voltage is R2+offset(R23), and offset(R23) is the offset corresponding to the difference R23.

If the first difference value R12 is smaller than the third difference value R23 and the second difference value R1Δ(0-1) is smaller than the fourth difference value R2Δ(0-1), determining a decreasing direction beginning at the second position as the direction for finding the optimum read voltage, and determining a offset value corresponding to the first difference value R12 as the offset for finding the optimum read voltage, as shown by arrow 204 in FIG. 2A, in this case, the determined reference voltage is R2−offset(R12), and offset(R12) is the offset corresponding to the difference R12.

If the first difference value R12 is greater than the third difference value R23 and the second difference value R1Δ(0-1) is smaller than the fourth difference value R2Δ(0-1), determining a decreasing direction beginning at the second position as the direction for finding the optimum read voltage, and determining a offset value corresponding to the first difference value R12 as the offset for finding the optimum read voltage, as shown by arrow 208 in FIG. 2B, the threshold voltage summit crosses to the right, in this case, the determined reference voltage is R2−offset(R12), and offset(R12) is the offset corresponding to the difference R12.

If the first difference value R12 is equal to the third difference value R23, acquiring bit counts of the first position, the second position, the third position again.

In an embodiment, the correspondence between difference value of bit count and offset is represented as $$\pm K \pm W\left(\frac{\Delta - R2}{R1 - R2}\right),$$

wherein the K is a predetermined offset of each group, the W is a voltage width of each group, the R1 is the first state bit count of the first position, the R2 is the first state bit count of the second position, and the Δ is the difference value between the first state bit count of the first position and the first state bit count of the second position.

Figure 3:
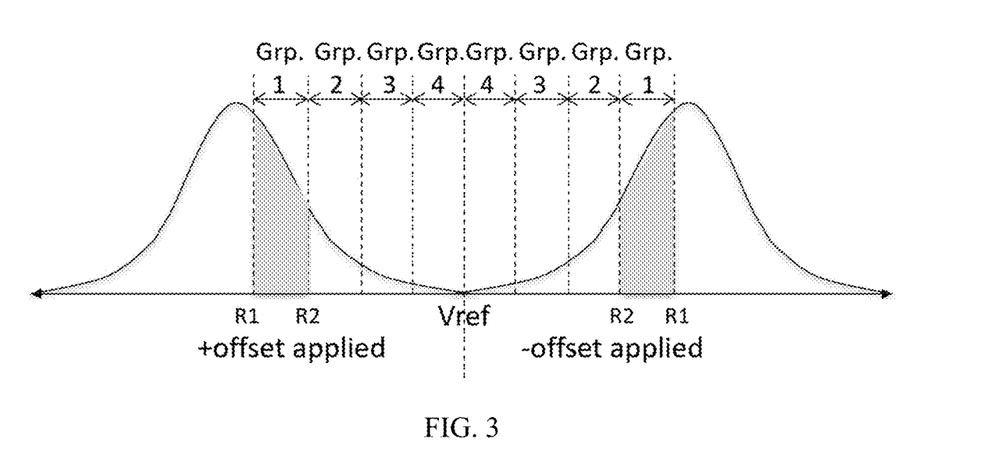
FIG. 3 schematically shows groups of threshold voltage region in accordance with an embodiment of the present disclosure.

In an embodiment, the correspondence between difference value of bit count and offset is represented as a lookup table which comprises multiple groups of bit count difference. Specifically: assuming that two adjacent threshold voltage ranges are symmetrically distributed, the threshold voltage ranges are grouped according to the bit count range, and the linear gradient of each region (group) is approximately the same. As shown in FIG. 3, each threshold voltage range on both sides of the symmetry center are divided into four groups symmetrically. The four groups on the left side represent the increase of the offset, and the four groups on the right side represent the decrease of the offset. The adjustment offset from each area to the optimum read reference voltage (the symmetry center of the two adjacent threshold voltage state distributions) can be predetermined and can be provided as a definite look-up table. The offset lookup table corresponding to the first difference R12 is shown in Table 1 below. K1, K2, K3, and K4 represent the predetermined offsets of the first to fourth groups, respectively, and W1, W2, W3, and W4 represent the voltage widths of the first to fourth groups, respectively.

TABLE 1

Offset lookup table corresponding
to the first difference R12

| R12 | Position | Offset |
| --- | --- | --- |
| >3000 | Summit | Invalid |
| 1500-3000 | High2 (Grp.1) | ±K1 ± W1 × (Δ − R2)/R12 |
| 500-1500 | High1 (Grp.2) | ±K2 ± W2 × (Δ − R2)/R12 |
| 200-500 | Mid (Grp.3) | ±K3 ± W3 × (Δ − R2)/R12 |
| 0-200 | Low (Grp.4) | ±K4 ± W4 × (Δ − R2)/R12 |

In an embodiment, K1 may be 30, K2 may be 20, K3 may be 10, K4 may be 0, and W1, W2, W3, and W4 may all be 10.

In the general correction process, usually a soft decision is adopted at the end to try to correct the error. However, when the reference voltage deviates too far from the intermediate value (optimum value), the correction time spent by the soft decision will become very long, its correction ability will also decrease, and finally it will not be able to correct the error. If the search algorithm of the offset lookup table is adopted, even if the reference voltage deviates from the intermediate value, the low-density parity-check code (LDPC) can still correct errors, so the overall correction capability will be greatly improved, and the correction time will be much shorter.

Step 106, reading with the offset applied to a current read reference voltage, upon read-success, the current reference voltage superimposed with the offset is the optimum read voltage and ending the operation, and upon read-error, obtaining a new first position and a new second position based on the direction and the offset for finding the optimum read voltage until reading gets successful.

Figure 4:
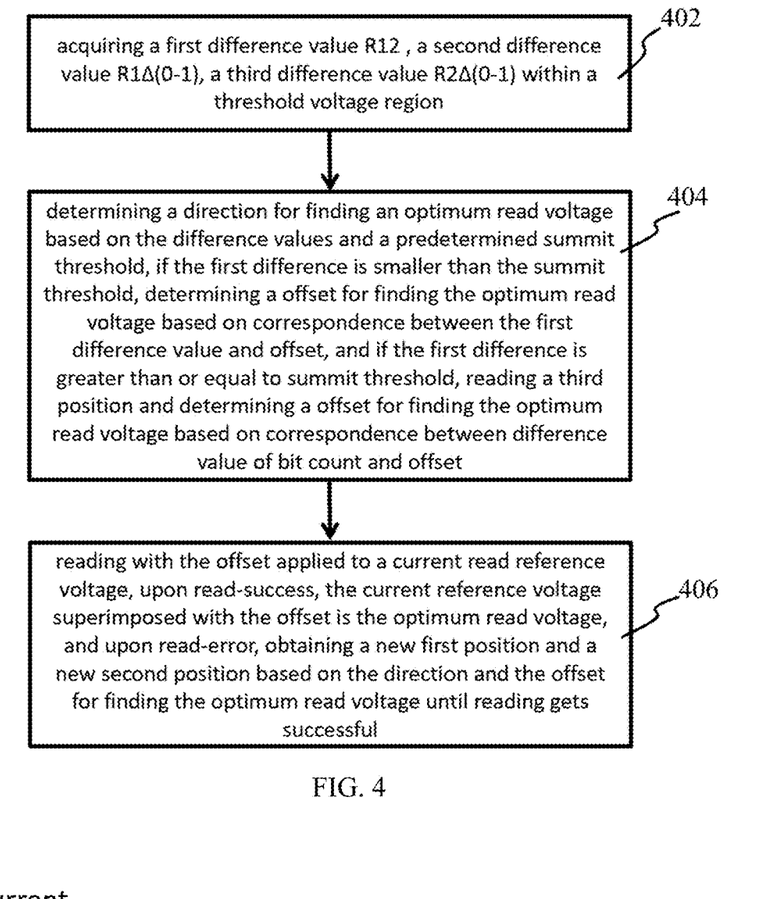
FIG. 4 is a flowchart of a process for finding optimum read voltage in accordance with another embodiment of the present disclosure.

As shown in FIG. 4, the method for finding optimum read voltage according to an embodiment comprises the following steps: Step 402, Step 404 and Step 406 discussed in the following.

Step 402: Acquiring a first difference value R12 between a first state bit count of a first position R1 and a first state bit count of a second position R2, a second difference value R1Δ(0-1) between the first state bit count and a second state bit count at the first position, and a third difference value R2Δ(0-1) between the first state bit count and the second state bit count at the second position within a threshold voltage region.

Step 404: Determining a direction for finding an optimum read voltage based on the difference values and a predetermined summit threshold ST, if the first difference R12 is smaller than the summit threshold ST, determining an offset for finding the optimum read voltage based on correspondence between the first difference value R12 and offset, as shown in FIG. 5A, in an embodiment, the step further comprises the following situations.

Figure 5A:
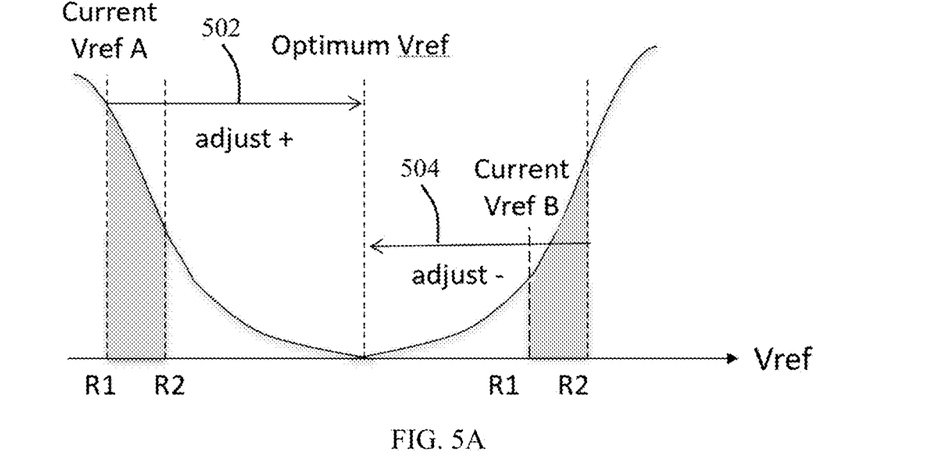
FIGS. 5A and 5B schematically show adjusting the Vref in accordance with another embodiment of the present disclosure.

If the second difference value R1Δ(0-1) is greater than the third difference value R2Δ(0-1), determining an increasing direction beginning at the first position as the direction for finding the optimum read voltage, as shown by arrow 502 in FIG. 5A, and determining a offset value corresponding to the first difference value R12 as the offset for finding the optimum read voltage, in this case, the determined reference voltage is R1+offset(R12), and offset(R12) is the offset corresponding to the difference R12.

If the second difference value R1Δ(0-1) is smaller than the third difference value R2Δ(0-1), determining a decreasing direction beginning at the second position as the direction for finding the optimum read voltage, as shown by arrow 504 in FIG. 5A, and determining a offset value corresponding to the first difference value R12 as the offset for finding the optimum read voltage, in this case, the determined reference voltage is R2+offset(R12), and offset(R12) is the offset corresponding to the difference R12.

Figure 5B:
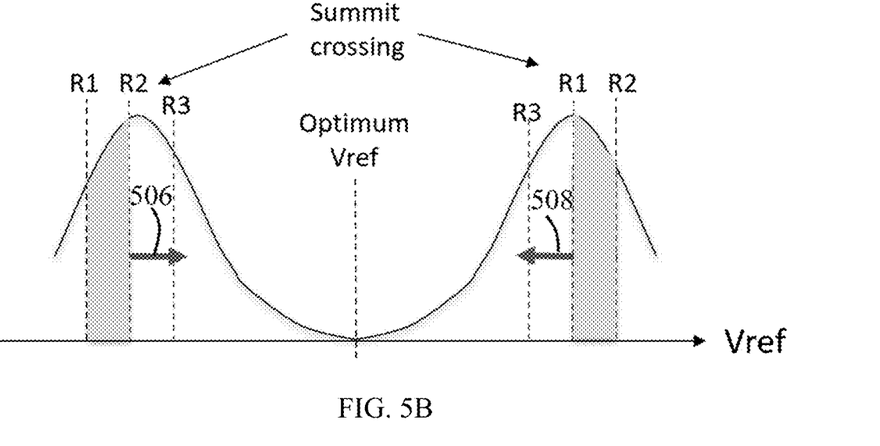

In other embodiments, if the first difference R12 is greater than or equal to summit threshold ST, calculating a third position according to the first difference value R12, the second difference value R1Δ(0-1), and the third difference value R2Δ(0-1), as shown in FIG. 5B, in an embodiment, the step further comprises the following situations.

If the second difference value R1Δ(0-1) is greater than the third difference value R2Δ(0-1), acquiring the first state bit count of a third position R3 and a fourth difference value R23 between the first state bit count of the second position R2 and the first state bit count of the third position R3, and determining an increasing direction beginning at the second position as the direction for finding the optimum read voltage, as shown by arrow 506 in FIG. 5B, and determining a offset value corresponding to the fourth difference value R23 as the offset for finding the optimum read voltage, in this case, the threshold voltage summit crosses to the left, the determined reference voltage is R2+offset(R23), and offset (R23) is the offset corresponding to the difference R23.

If the second difference value R1Δ(0-1) is smaller than the third difference value R2Δ(0-1), acquiring the first state bit count of a third position R3 and a fifth difference value R13 between the first state bit count of the first position R1 and the first state bit count of the third position R3, as shown by arrow 508 in FIG. 5B, and determining a decreasing direction beginning at the first position as the direction for finding the optimum read voltage, and determining a offset value corresponding to the fifth difference value R13 as the offset for finding the optimum read voltage, in this case, the threshold voltage summit crosses to the right, the determined reference voltage is R1−offset(R13), and offset(R13) is the offset corresponding to the difference R13.

Furthermore, if the second difference value R1Δ(0-1) is equal to the third difference value R2Δ(0-1), acquiring bit counts of the first position and the second position again.

Step 406: Reading with the offset applied to a current read reference voltage, upon read-success, the current reference voltage superimposed with the offset is the optimum read voltage and ending the operation, and upon read-error, obtaining a new first position and a new second position based on the direction and the offset for finding the optimum read voltage until reading gets successful.

Compared with the method 100 for finding the optimum read voltage, the method 400 firstly only needs to obtain the first position and the second position, and only in the cases of summit crossing, the third position needs to be obtained. The method 400 can further shorten the time of finding the optimum read voltage.

Figure 6:
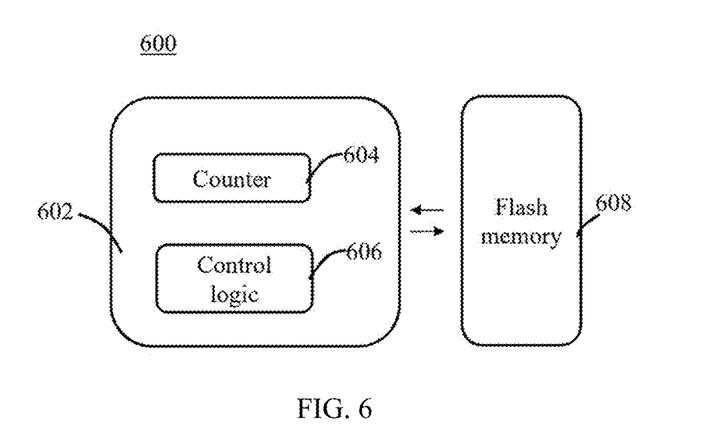
FIG. 6 schematically shows a flash memory system in accordance with an embodiment of the present disclosure.

This embodiment also provides a flash memory system, FIG. 2 shows a schematic diagram of the flash memory system 600, the system comprises a storage controller 602 and a flash memory 608. The flash memory 608 acquires control signals from the controller 602 and perform operations corresponding to the control signals. The flash memory 608 returns execution results of the operation corresponding to the control signal to the memory controller. For example, in response to a control signal, the flash memory 608 may perform a read operation, a program operation, or an erase operation, or information about the read data, whether programming has been completed, and whether erasing has been completed to the memory controller 602. For example, perform the read operation of the above-mentioned bit count.

In other embodiments, the storage controller 602 may comprise a counter 604 and control logic 606, configured to acquire a first difference value between a first state bit count of a control logic 608. The counter 604 is configured to acquire first position and a first state bit count of a second position, a second difference value between the first state bit count and a second state bit count at the first position, a third difference value between the first state bit count of the second position and the first state bit count of a third position, and a fourth difference value between the first state bit count and the second state bit count at the second position within a threshold voltage region.

The control logic 606 is configured to determine a direction for finding an optimum read voltage based on the difference values, and determining a offset for finding the optimum read voltage based on correspondence between difference value of bit count and offset, and read with the offset applied to a current read reference voltage, upon read-success finishing the operation, and upon read-error obtaining a new first position and a new second position based on the direction and the offset for finding the optimum read voltage until reading gets successful.

In an embodiment, the present invention provides a method for finding optimum read voltage, the method comprises the follow steps:
  acquiring a first difference value between a first state bit count of a first position and a first state bit count of a second position, a second difference value between the first state bit count and a second state bit count at the first position, a third difference value between the first state bit count of the second position and the first state bit count of a third position, and a fourth difference value between the first state bit count and the second state bit count at the second position within a threshold voltage region;
  determining a direction for finding an optimum read voltage based on the difference values, and determining an offset for finding the optimum read voltage based on correspondence between difference value of bit count and offset; and
  reading with the offset applied to a current read reference voltage, upon read-success, the current reference voltage superimposed with the offset is the optimum read voltage, and upon read-error, obtaining a new first position and a new second position based on the direction and the offset for finding the optimum read voltage until reading gets successful.

In an embodiment, the step of determining a direction for finding an optimum read voltage based on the difference values, and determining an offset for finding the optimum read voltage based on correspondence between difference value of bit count and offset further comprises:
  if the first difference value is greater than the third difference value and the second difference value is greater than the fourth difference value, determining an increasing direction beginning at the first position as the direction for finding the optimum read voltage, and determining an offset value corresponding to the first difference value as the offset for finding the optimum read voltage;
  if the first difference value is smaller than the third difference value and the second difference value is greater than the fourth difference value, determining an increasing direction beginning at the second position as the direction for finding the optimum read voltage, and determining an offset value corresponding to the third difference value as the offset for finding the optimum read voltage;
  if the first difference value is smaller than the third difference value and the second difference value is smaller than the fourth difference value, determining a decreasing direction beginning at the second position as the direction for finding the optimum read voltage, and determining an offset value corresponding to the first difference value as the offset for finding the optimum read voltage; and
  if the first difference value is greater than the third difference value and the second difference value is smaller than the fourth difference value, determining a decreasing direction beginning at the second position as the direction for finding the optimum read voltage, and determining an offset value corresponding to the first difference value as the offset for finding the optimum read voltage; and if the first difference value is equal to the third difference value, acquiring bit counts of the first position, the second position, the third position again.

In an embodiment, the correspondence between difference value of bit count and offset is represented as $$\pm K \pm W\left(\frac{\Delta - R2}{R1 - R2}\right),$$

wherein the K is a predetermined offset of each group, the W is a voltage width of each group, the R1 is the first state bit count of the first position, the R2 is the first state bit count of the second position, and the $\Delta$ is the difference value between the first state bit count of the first position and the first state bit count of the second position.

In an embodiment, the correspondence between difference value of bit count and offset is represented as a lookup table, which comprises multiple groups of bit count difference.

In an embodiment, the present invention provides a method for finding optimum read voltage, the method comprises the follow steps:
  acquiring a first difference value between a first state bit count of a first position and a first state bit count of a second position, a second difference value between the first state bit count and a second state bit count at the first position, and a third difference value between the first state bit count and the second state bit count at the second position within a threshold voltage region;
  determining a direction for finding an optimum read voltage based on the difference values and a predetermined summit threshold, if the first difference is smaller than the summit threshold, determining a offset for finding the optimum read voltage based on correspondence between the first difference value and offset; if the first difference is greater than or equal to summit threshold, calculating a third position according to the first difference value, second difference value and the third difference value, reading a first state bit count of the third position and acquiring a fourth difference value between the first state bit count of the second position and the first state bit count of the third position or a fifth difference value between the first state bit count of the first position and the first state bit count of the third position, and determining a offset for finding the optimum read voltage based on correspondence between difference value of bit count and offset; and
  reading with the offset applied to a current read reference voltage, upon read-success, the current reference voltage superimposed with the offset is the optimum read voltage, and upon read-error, obtaining a new first position and a new second position based on the direction and the offset for finding the optimum read voltage until reading gets successful.

In an embodiment, if the first difference is smaller than summit threshold, the step of determining an offset for finding the optimum read voltage based on correspondence between the first difference value and offset, further comprises:
  if the second difference value is greater than the third difference value, determining an increasing direction beginning at the first position as the direction for finding the optimum read voltage, and determining an offset value corresponding to the first difference value as the offset for finding the optimum read voltage; and
  if the second difference value is smaller than the third difference value, determining a decreasing direction beginning at the second position as the direction for finding the optimum read voltage, and determining an offset value corresponding to the first difference value as the offset for finding the optimum read voltage.

In an embodiment, if the first difference is greater than or equal to the summit threshold, calculating a third position according to the first difference value, second difference value and the third difference value, reading a first state bit count of the third position and acquiring a fourth difference value between the first state bit count of the second position and the first state bit count of the third position or a fifth difference value between the first state bit count of the first position and the first state bit count of the third position, and determining a offset for finding the optimum read voltage based on correspondence between difference value of bit count and offset, further comprises:
  if the second difference value is greater than the third difference value, the third position is located on the right side of the second position, acquiring the fourth difference value between the first state bit count of the second position and the first state bit count of the third position, and determining an increasing direction beginning at the second position as the direction for finding the optimum read voltage, and determining a offset value corresponding to the fourth difference value as the offset for finding the optimum read voltage; and
  if the second difference value is smaller than the third difference value, the third position is located on the left side of the first position, acquiring the fifth difference value between the first state bit count of the first position and the first state bit count of the third position, and determining a decreasing direction beginning at the first position as the direction for finding the optimum read voltage, and determining a offset value corresponding to the fifth difference value as the offset for finding the optimum read voltage.

In an embodiment, the correspondence between difference value of bit count and offset is represented as $$\pm K \pm W\left(\frac{\Delta - R2}{R1 - R2}\right),$$

wherein the K is a predetermined offset of each group, the W is a voltage width of each group, the R1 is the first state bit count of the first position, the R2 is the first state bit count of the second position, and the $\Delta$ is the difference value between the first state bit count of the first position and the first state bit count of the second position.

In an embodiment, the correspondence between difference value of bit count and offset is represented as a lookup table which comprises multiple groups of bit count difference.

In an embodiment, if the second difference value is equal to the third difference value, acquiring bit counts of the first position and the second position again.

In an embodiment, the present invention provides a flash memory system, the system comprises a counter which is configured to acquire a first difference value between a first state bit count of a first position and a first state bit count of a second position, a second difference value between the first state bit count and a second state bit count at the first position, a third difference value between the first state bit count of the second position and the first state bit count of a third position, and a fourth difference value between the first state bit count and the second state bit count at the second position within a threshold voltage region; and a control logic which is configured to determine a direction for finding an optimum read voltage based on the difference values, and determining a offset for finding the optimum read voltage based on correspondence between difference value of bit count and offset; and reading with the offset applied to a current read reference voltage, upon read-success, the current reference voltage superimposed with the offset is the optimum read voltage, and upon read-error, obtaining a new first position and a new second position based on the direction and the offset for finding the optimum read voltage until reading gets successful.

The implementation of the present invention, the optimum read reference voltage is determined based on a single threshold voltage distribution, so as to improve the probability of soft-decision success.

Compared with the existing technology, embodiments of the present invention apply bit count which has no constraints in the degree of errors. It gets to the point of state uniformity of a page, a unit of program and read. To reduce physical interference among neighboring cells, randomization of data for programming is applied, which makes near-equal allocation of all states (eight for TLC type page) among all cells of a page and each state is decoded to one of bits. When the read voltage Vref is at optimum level, the bit count difference corresponding to two adjacent states is at a minimum. The scheme according to embodiments of the present invention searches for a smaller delta in bit count. This scheme does not work if data is not written in uniform allocation among all states. But data randomization at write is applied as standard to all NAND flash memory today.

Another major improvement of embodiments of the present invention is fast speed by inferring optimum read voltage Vref based on bit count difference at two Vrefs. The target NAND die distribution is pre-characterized for bit count profile by different Vrefs which is used for lookup table of bit count difference and distance to optimum Vref. Referring current bit count difference at two Vrefs to lookup table allows for instant inference of optimum Vref without continuous reading with each Vref change.

It should be noted that in the application documents of the present patent, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In the application file of this patent, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this invention as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for finding an optimum read voltage, the method comprising:
   acquiring a first difference value (R12) between a first state bit count of a first position (R1) and a first state bit count of a second position (R2), a second difference value (R1Δ(0-1)) between the first state bit count and a second state bit count at the first position, a third difference value (R23) between the first state bit count of the second position (R2) and a first state bit count of a third position (R3), and a fourth difference value (R2Δ(0-1)) between the first state bit count and the second state bit count at the second position within a threshold voltage region;
   determining a direction for finding the optimum read voltage based on the difference values, and determining an offset for finding the optimum read voltage based on correspondence between a difference value of bit count and offset; and
   reading with the offset applied to a current read reference voltage, wherein, upon read-success, the current reference voltage superimposed with the offset is the optimum read voltage, and upon read-error, a new first position and a new second position are obtained based on the direction and the offset for finding the optimum read voltage until reading becomes successful.

2. The method for finding the optimum read voltage of claim 1, wherein the step of determining a direction for finding the optimum read voltage based on the difference values, and determining the offset for finding the optimum read voltage based on correspondence between the difference value of bit count and offset further comprises:
   if the first difference value (R12) is greater than the third difference value (R23) and the second difference value (R1Δ(0-1)) is greater than the fourth difference value (R2Δ(0-1)), determining an increasing direction beginning at the first position as the direction for finding the optimum read voltage, and determining an offset value corresponding to the first difference value (R12) as the offset for finding the optimum read voltage;

if the first difference value (R12) is smaller than the third difference value (R23) and the second difference value (R1Δ(0-1)) is greater than the fourth difference value (R2Δ(0-1)), determining an increasing direction beginning at the second position as the direction for finding the optimum read voltage, and determining an offset value corresponding to the third difference value (R23) as the offset for finding the optimum read voltage;

if the first difference value (R12) is smaller than the third difference value (R23) and the second difference value (R1Δ(0-1)) is smaller than the fourth difference value (R2Δ(0-1)), determining a decreasing direction beginning at the second position as the direction for finding the optimum read voltage, and determining an offset value corresponding to the first difference value (R12) as the offset for finding the optimum read voltage; and if the first difference value (R12) is greater than the third difference value (R23) and the second difference value (R1Δ(0-1)) is smaller than the fourth difference value (R2Δ(0-1)), determining a decreasing direction beginning at the second position as the direction for finding the optimum read voltage, and determining an offset value corresponding to the first difference value (R12) as the offset for finding the optimum read voltage; and if the first difference value (R12) is equal to the third difference value (R23), acquiring bit counts of the first position, the second position, the third position again.

3. The method for finding the optimum read voltage of claim 2, wherein the correspondence between the difference value of bit count and offset is represented as $$\pm K \pm W\left(\frac{\Delta - R2}{R1 - R2}\right),$$

wherein the K is a preset offset of each group, the W is a voltage width of each group, the R1 is the first state bit count of the first position, the R2 is the first state bit count of the second position, and the Δ is the difference value between the first state bit count of the first position and first state bit count of the second position.

4. The method for finding the optimum read voltage of claim 2, wherein the correspondence between the difference value of bit count and offset is represented as a lookup table which comprises multiple groups of bit count difference.

5. A method for finding an optimum read voltage, the method comprising:

acquiring a first difference value (R12) between a first state bit count of a first position (R1) and a first state bit count of a second position (R2), a second difference value (R1Δ(0-1)) between the first state bit count and a second state bit count at the first position, and a third difference value (R2Δ(0-1)) between the first state bit count and the second state bit count at the second position within a threshold voltage region;

determining a direction for finding the optimum read voltage based on the difference values and a preset summit threshold (ST), wherein:

if the first difference (R12) is smaller than the summit threshold (ST), an offset for finding the optimum read voltage is determined based on correspondence between the first difference value (R12) and offset; and if the first difference (R12) is greater than or equal to summit threshold (ST), a third position is calculated according to the first difference value (R12), second difference value (R1Δ(0-1)) and the third difference value (R2Δ(0-1)), a first state bit count of the third position (R3) is read, and a fourth difference value (R23) between the first state bit count of the second position (R2) and the first state bit count of the third position (R3) or a fifth difference value (R13) between the first state bit count of the first position (R1) and the first state bit count of the third position (R3) is acquired, and an offset for finding the optimum read voltage is determined based on correspondence between a difference value of bit count and offset; and reading with the offset applied to a current read reference voltage, wherein, upon read-success, the current reference voltage superimposed with the offset is the optimum read voltage, and upon read-error, a new first position and a new second position are obtained based on the direction and the offset for finding the optimum read voltage until reading becomes successful.

6. The method for finding the optimum read voltage of claim 5, wherein, if the first difference (R12) is smaller than summit threshold (ST), the step of determining the offset for finding the optimum read voltage based on correspondence between the first difference value (R12) and offset, further comprises:

if the second difference value (R1Δ(0-1)) is greater than the third difference value (R2Δ(0-1)), determining an increasing direction beginning at the first position as the direction for finding the optimum read voltage, and determining an offset value corresponding to the first difference value (R12) as the offset for finding the optimum read voltage; and if the second difference value (R1Δ(0-1)) is smaller than the third difference value (R2Δ(0-1)), determining a decreasing direction beginning at the second position as the direction for finding the optimum read voltage, and determining an offset value corresponding to the first difference value (R12) as the offset for finding the optimum read voltage.

7. The method for finding the optimum read voltage of claim 6, wherein, if the first difference (R12) is greater than or equal to summit threshold (ST), calculating the third position according to the first difference value (R12), the second difference value (R14(0-1)) and the third difference value (R2Δ(0-1)), reading the first state bit count of the third position (R3) and acquiring the fourth difference value (R23) between the first state bit count of the second position (R2) and the first state bit count of the third position (R3) or the fifth difference value (R13) between the first state bit count of the first position (R1) and the first state bit count of the third position (R3), and determining the offset for finding the optimum read voltage based on correspondence between difference value of bit count and offset, further comprises:

if the second difference value (R1Δ(0-1)) is greater than the third difference value (R2Δ(0-1)), the third position is located on the right side of the second position, the method further comprising acquiring the fourth difference value (R23) between the first state bit count of the second position (R2) and the first state bit count of the third position (R3), and determining an increasing direction beginning at the second position as the direction for finding the optimum read voltage, and determining an offset value corresponding to the fourth difference value (R23) as the offset for finding the optimum read voltage; and if the second difference value (R1Δ(0-1)) is smaller than the third difference value (R2Δ(0-1)), the third position is located on the left side of the first position, the method further comprising acquiring the fifth difference value (R13) between the first state bit count of the first position (R1) and the first state bit count of the third position (R3), and determining a decreasing direction beginning at the first position as the direction for finding the optimum read voltage, and determining an offset value corresponding to the fifth difference value (R13) as the offset for finding the optimum read voltage.

8. The method for finding the optimum read voltage of claim 7, wherein, if the second difference value (R1Δ(0-1)) is equal to the third difference value (R2Δ(0-1)), the method further comprises acquiring bit counts of the first position and the second position again.

9. The method for finding the optimum read voltage of claim 7, wherein the correspondence between the difference value of bit count and offset is represented as $$\pm K \pm W\left(\frac{\Delta - R2}{R1 - R2}\right),$$

wherein the K is a preset offset of each group, the W is a voltage width of each group, the R1 is the first state bit count of the first position, the R2 is the first state bit count of the second position, and the Δ is the difference value between the first state bit count of the first position and the first state bit count of the second position.

10. The method for finding the optimum read voltage of claim 7, wherein the correspondence between the difference value of bit count and offset is represented as a lookup table which comprises multiple groups of bit count difference.

11. A flash memory system, comprising:
a counter configured to acquire a first difference value (R12) between a first state bit count of a first position (R1) and a first state bit count of a second position (R2), a second difference value (R1Δ(0-1)) between the first state bit count and a second state bit count at the first position, a third difference value (R23) between the first state bit count of the second position (R2) and a first state bit count of a third position (R3), and a fourth difference value (R2Δ(0-1)) between the first state bit count and the second state bit count at the second position within a threshold voltage region; and control logic configured to:
  determine a direction for finding an optimum read voltage based on the difference values, and determining an offset for finding the optimum read voltage based on correspondence between a difference value of bit count and offset; and
  reading with the offset applied to a current read reference voltage, wherein, upon read-success, the current reference voltage superimposed with the offset is the optimum read voltage, and upon read-error, a new first position and a new second position are obtained based on the direction and the offset for finding the optimum read voltage until reading becomes successful.

* * * * *